United States Patent
Andideh et al.

[11] Patent Number: 5,877,072
[45] Date of Patent: Mar. 2, 1999

[54] PROCESS FOR FORMING DOPED REGIONS FROM SOLID PHASE DIFFUSION SOURCE

[75] Inventors: Ebrahim Andideh; Scott E. Thompson, both of Portland, Oreg.

[73] Assignee: Intel Corporation, Santa Clara, Calif.

[21] Appl. No.: 829,113

[22] Filed: Mar. 31, 1997

[51] Int. Cl.$^6$ .................................................. H01L 21/385
[52] U.S. Cl. ........................... 438/563; 438/783; 438/301
[58] Field of Search .................................... 438/561, 563, 438/558, 562, 778, 783, 784, 787, 790, 920, 974, 923, 301, 303, 230, 231, 385, 935; 148/DIG. 3, DIG. 35, DIG. 144; 427/481.1, 255.1, 255.2, 255.3

[56] References Cited

U.S. PATENT DOCUMENTS

| 4,782,036 | 11/1988 | Becker et al. | 438/563 |
|---|---|---|---|
| 5,354,715 | 10/1994 | Wang et al. | 438/784 |
| 5,518,945 | 5/1996 | Bracchitta et al. . | |
| 5,531,183 | 7/1996 | Krishnam | 438/784 |
| 5,716,890 | 2/1998 | Yao | 438/624 |

FOREIGN PATENT DOCUMENTS

404369854(A) 12/1998 Japan .

OTHER PUBLICATIONS

*Olin Electronic Materials Diffusion Systems*, Product Data Sheet No. EBB010694.
"A New Half–Micron p–Channel Mosfet with Latips" (LARGE–TILT–ANGLE IMPLANTED PUNCH THROUGH STOPPER), Hori & Kurimoto, *IEDM 88*.beginning at p. 394.

*Primary Examiner*—John F. Niebling
*Assistant Examiner*—S. Mulpuri
*Attorney, Agent, or Firm*—Blakely, Sokoloff, Taylor & Zafman LLP

[57] ABSTRACT

A process for doping a region in a substrate from a solid phase source. An inert gas is bubbled through a dopant containing ester and supplied to a chamber along with the gases used to form a silicon dioxide layer such as a TEOS formed layer. The flow of the inert gas can be modulated to grade the dopant concentration in the silicon dioxide layer. The dopant is diffused from the silicon dioxide layer into the substrate to form, for instance, source and drain regions in field-effect transistors.

20 Claims, 2 Drawing Sheets

PROCESS FOR FORMING DOPED REGIONS FROM SOLID PHASE DIFFUSION SOURCE

BACKGROUND OF THE INVENTION

1. Field of the invention

The invention relates to the field of doping a semiconductor substrate from a solid phase dopant source.

2. Prior art

As critical dimensions in semiconductor fabrication technology become smaller, it becomes necessary to form shallower doped regions such as source and drain regions in field-effect transistors. One technique for achieving shallower regions is to diffuse the dopant from a solid phase dopant source such as described in U.S. Pat. No. 5,518,945.

It is important to control the amount of dopant in the solid phase diffusion source and to provide a reliable, easy to fabricate source.

The chemistry used in the present invention employs organic esters such as triethylborate (TEB) as a source of dopant for the solid phase dopant source. These esters have been used as a source of p-type and n-type dopant to form for instance, boron and phosphorus doped glass layer which can be reflowed. Such glass layers are used as interlayer dielectrics.

SUMMARY OF THE INVENTION

A process for doping a substrate region such as a source or drain region in a field-effect transistor is described. First, the surface of the substrate overlying the region is cleaned. The substrate is then exposed to first gases which cause the formation of a silicon dioxide layer. The substrate is also exposed to a carrier gas which has bubbled through an organic ester containing a dopant. As the silicon dioxide layer forms, it is doped from the dopant in the carrier gas. Finally the dopant is driven from the silicon dioxide layer into the substrate forming the doped substrate region.

DETAILED DESCRIPTION OF THE INVENTION

A process for forming a solid state or solid phase diffusion source particularly useful for forming source and drain regions in field-effect transistors is described. In the following description numerous specific details are set forth such as specific chemicals, flow rates, temperatures, etc., in order to provide a thorough understanding of the present invention. It will be apparent that the present invention can be practiced without these specific details. In other instances, well-known steps have not been described in detail in order not to unnecessarily obscure the present invention.

Figure 1:
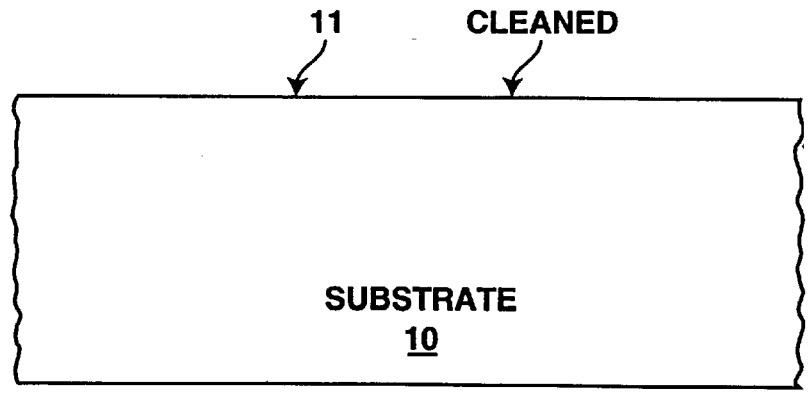
FIG. 1 is a cross sectional elevation view of a portion of a substrate.

Referring to FIG. 1, a cross sectional elevation view of a portion of a monocrystalline silicon substrate 10 is illustrated having an upper surface 11. It is assumed for purposes of discussion that a doped region is to be formed in the substrate 10 at surface 11.

Figure 2:
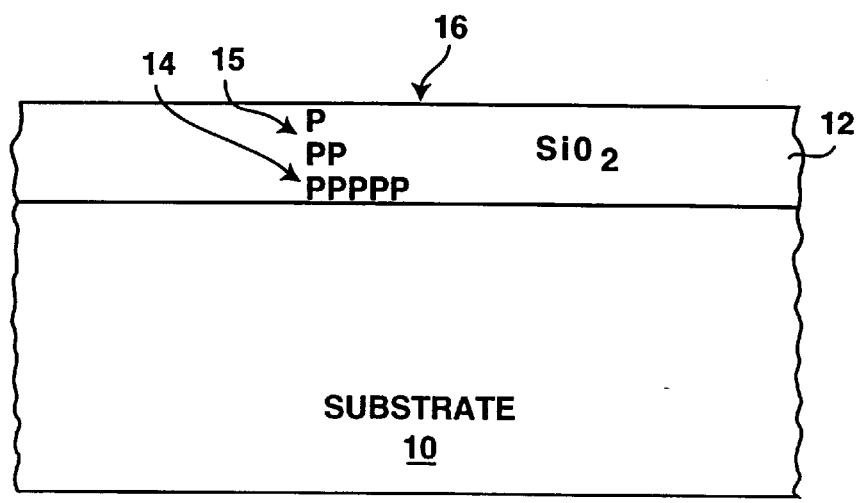
FIG. 2 illustrates the substrate of FIG. 1 after a doped silicon dioxide layer has been formed on the substrate.

As illustrated in FIG. 2 a doped silicon dioxide layer 12 is formed as taught by the present invention. Moreover, as will be discussed in greater detail the dopant in the silicon dioxide layer 10 may be graded such that there is more dopant at the interface between the substrate 10 and the layer 12 than at the surface 16 of layer 12. This is illustrated in FIG. 2 by the p-type dopant 14 shown at the interface between layer 12 and the substrate 10 and the lower concentration of p-type dopant 15 near the surface 16.

Figure 3:
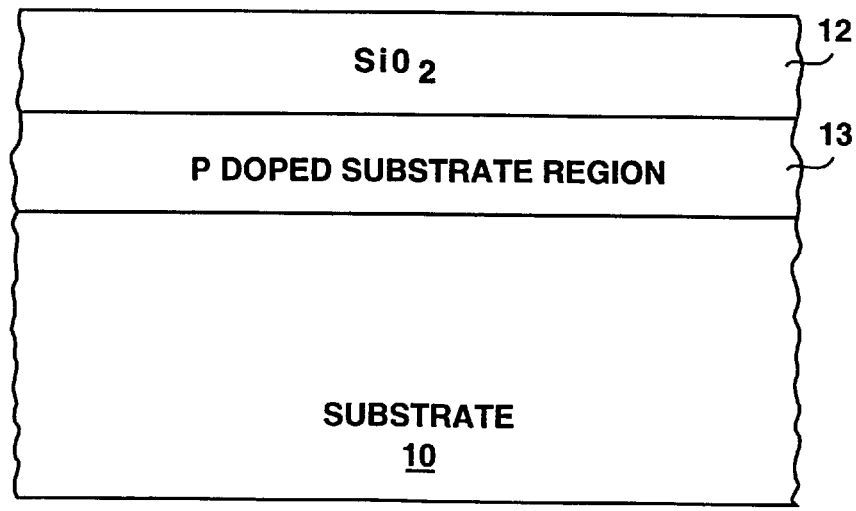
FIG. 3 illustrates the substrate of FIG. 2 after the dopant has been diffused from the silicon dioxide layer into the into the substrate.

As illustrated in FIG. 3 the dopant from the silicon dioxide layer 12 is diffused into the substrate 10 forming the doped region 13 as will be discussed in greater detail.

Other processing steps may occur after the cleaning of the surface 11 and after the formation of the layer 12. For instance, the layer 12 may be used to form part of spacers adjacent to a polycrystalline silicon gate of a field-effect transistor before the dopant is diffused into the substrate. Such processing and related processing is described in the following co-pending applications: "Formation of Source and Drain from Doped Glass", Ser. No. 08/538,846, filed Oct. 4, 1995; "Screening Oxide for Source and Drain Regions Formed from Solid Dopant Source", Ser. No. 08/716,772, filed Sep. 24, 1996; and "Method for Forming Shallow Source and Drain Region Extensions in Field-effect Transistor", Ser. No. 08/777,254, filed Dec. 31, 1996. All of the above applications are assigned to the Assignee of the present application.

Referring again to FIG. 1, the first step in the processing is the cleaning of the surface 11 of the substrate 10. Any of a plurality of well-known cleaning steps may be used. For instance, the wafer may be cleaned in situe or ex-situe by an argon plasma or in a fluorinated plasma (NF3) or in any non polymer forming plasma. This cleaning step removes, by way of example, non-uniform native oxides which can prevent a uniform diffusion of dopant into the wafer. This cleaning step is used even where a screening oxide is formed between the substrate and the doped silicon dioxide layer.

Figure 4:
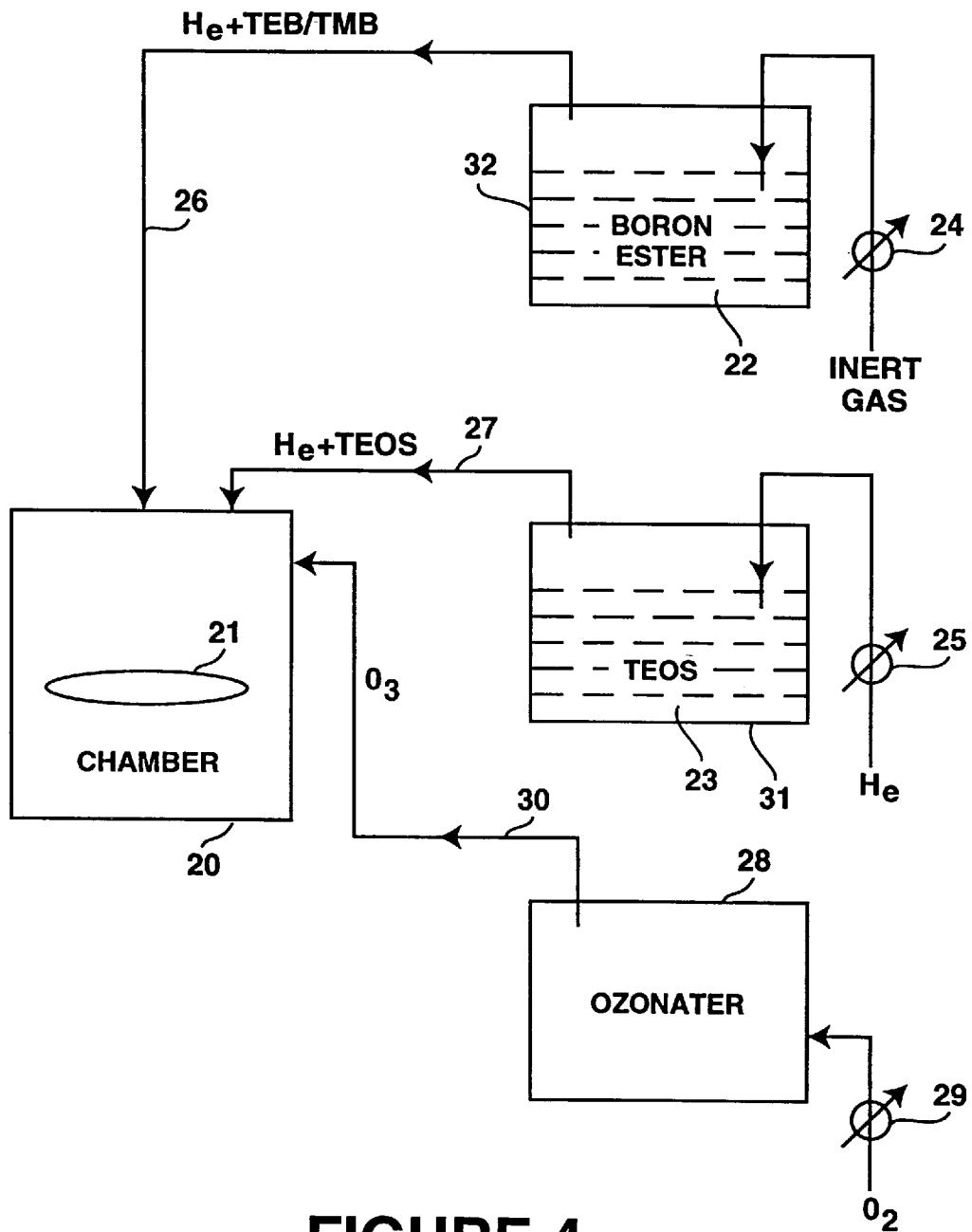
FIG. 4 illustrates an apparatus for forming the doped silicon dioxide layer of FIGS. 2 and 3.

The substrate or wafer is then placed in a chamber 20 as shown by wafer 21 in FIG. 4. (As mentioned earlier, the wafer may already be in chamber 20 where the cleaning is done in situe.) The doped silicon dioxide layer shown in FIG. 2 is deposited on the wafer in chamber 20. In one embodiment the silicon dioxide is formed from a tetraethyl orthosilicate (TEOS) chemistry. This is shown by the liquid TEOS 23 in container 31 of FIG. 4. A carrier gas such as helium is metered through the valve 25 and passed through the TEOS and then directed into the chamber 20 through the line 27. Ozone is also provided to the chamber 20 from the ozonater 28. Oxygen is metered through the valve 29 into the ozonater to form the ozone.

Where the silicon dioxide layer is to be doped with a p-type dopant, a boron ester 22 from container 32 is carried into the chamber 20 by an inert carrier gas such as helium. The carrier gas is metered through the valve 24 into the container 32 and bubbles through the boron ester. The carrier gas with the boron ester is then delivered to the chamber via the line 26.

The boron ester may comprise an organic ester such as trimethyl borate (TMB) or a triethylborate (TEB). A microelectronic grade of purity is used.

For the apparatus of FIG. 4 the chamber may be maintained at a temperature of 300° C. to 550° C. with helium bubbling through either the TMB or the TEB at a flow of 50 sccm to 400 sccm. The ester may be maintained at 25° C. to 50° C. Typically the silicon dioxide layer is formed to a thickness of 80 Å to 300 Å with an ozone flow of 2000–5000 sccm of 10–13 weight percent ozone in oxygen and a carrier gas flow through the TEOS of 2000–5000 sccm.

The flow of the carrier gas through the ester may be modulated from for instance, 50 sccm to 400 sccm by controlling the valve 24. This allows the dopant concentration to be varied in the direction of growth of the silicon dioxide layer. In one embodiment a dopant gradient is developed in the silicon dioxide layer 12 with a higher dopant concentration (e.g., from a flow of 400 sccm) at the interface with the substrate and a lower dopant concentration (e.g., from a flow at 50 sccm) at the surface 16 as shown in FIG. 2. The lower concentration of dopant at the surface 16 helps to prevent the dopant from evaporating through the surface 16.

An undoped capping layer may be formed on surface 16 to prevent the loss of dopant. This may be formed by stopping the flow of the carrier gas which passes through the ester while silicon dioxide continues to form. The capping layer may instead be a dielectric material such as oxynitride or silicon nitride.

Following the formation of the doped silicon dioxide layer other processing occurs before the dopant is driven into the substrate Then rapid thermal anneal is used in one embodiment to drive the dopant from the silicon dioxide layer into the substrate.

The sheet resistance that can be obtained by modulating the flow through the valve 24 of FIG. 4 may range from between approximately 40 ohms per square to 1000 ohms per square. This spread of sheet resistance results from controlling the flow of the carrier gas into the container 32 from approximately 50 sccm to approximately 400 sccm.

In practice the flow of the ozone from the ozonater and flow of the carrier gas from the container 32 can begin at the same time, or the gas through the container 32 can be stabilized before ozone is delivered from the ozonater.

While helium is discussed above as the carrier gas that is bubbled through the ester, other gases such as nitrogen, argon, xenon or krypton may be used. Additionally, other chemistries may be used to form the silicon dioxide layer such as silane-based chemistry. A TEOS or silane plasma process may be used to form the silicon dioxide layer. Hydrogen may be used as a carrier gas where the chemistry is not based on gaseous oxygen. Also an ester such as a phosphorous containing ester (TEP) may be used to obtain an n-doped glass where n-type doped regions are to be formed.

Thus, a process has been described for doping a substrate region from solid phase dopant sources.

We claim:

1. A process for doping a source and drain region in a substrate comprising the steps of:

cleaning a surface of the substrate overlying the regions;

exposing the substrate to first gases which cause the formation of a silicon dioxide layer;

modulating the flow of a carrier gas through an organic ester containing a dopant onto the substrate causing the silicon dioxide layer to be doped as it is formed on the substrate, the modulating causing the silicon dioxide layer to have a higher concentration of dopant near the surface of the substrate and lower concentrations as the layer continues to form; and driving the dopant from the doped silicon dioxide layer into the substrate to form the source and drain region for a transistor.

2. The process defined by claim 1 wherein the first gases comprise tetraethyl orthosilicate.

3. The process defined by claim 1 wherein the first gases include silane.

4. The process defined by claim 1 wherein the carrier gas is an inert gas.

5. The process defined by claim 4 wherein the inert gas is selected from the group of helium, argon, xenon, and nitrogen.

6. A process for doping a region of a source and drain region in a substrate with a p-type dopant comprising the steps of:

cleaning a surface of the substrate at the region;

subjecting the substrate in a chamber to first gases which cause the formation of a silicon oxide layer;

modulating the flow of an inert gas through and organic borate ester into the chamber in the presence of the first gases to dope the silicon dioxide layer with a p-type dopant causing the silicon dioxide layer to be doped as it is formed on the substrate, the modulating causing the silicon dioxide layer to have a higher concentration of dopant near the surface of the substrate and lower concentrations as the layer continues to form; and diffusing the p-type dopant from the silicon dioxide layer into the substrate to form the source and drain region for a transistor.

7. The process defined by claim 6 wherein the organic borate ester comprises triethylborate.

8. The process defined by claim 6 wherein the organic borate ester comprises trimethyl borate.

9. The process defined by claim 7 wherein the first gases comprise tetraethyl orthosilicate.

10. The process defined by claim 8 wherein the first gases comprise tetraethyl orthosilicate.

11. The process defined by claim 6 wherein the inert gas is flowing at a rate of between approximately 50 sccm and 400 sccm.

12. The process defined by claim 9 wherein the inert gas is flowing at a rate of between approximately 50 sccm and 400 sccm.

13. The process defined by claim 10 wherein the inert gas is flowing at a rate of between approximately 50 sccm and 400 sccm.

14. The process defined by claim 6 wherein the flow of the inert gas is modulated so as to vary the p-type dopant concentration in a direction of formation of the silicon dioxide layer.

15. The process defined by claim 9 wherein the flow of the inert gas is modulated so as to vary the p-type dopant concentration in the silicon dioxide layer.

16. The process defined by claim 10 wherein the flow of the inert gas is modulated so as to vary the p-type dopant concentration in the silicon dioxide layer.

17. A process for forming a solid phase dopant source for a source and drain region comprising the steps of:

exposing a substrate to first gases which cause the formation of a silicon dioxide layer;

modulating the flow of an inert gas through an organic ester containing a dopant onto the substrate causing the silicon dioxide layer to be doped as it is formed on the substrate, the modulating causing the silicon dioxide layer to have a higher concentration of dopant near the surface of the substrate and lower concentrations as the layer continues to form; and diffusing the dopant from the silicon dioxide layer into the substrate to form the source and drain region for a transistor.

18. The process defined by claim 16 wherein the organic borate ester comprises triethylborate.

19. The process defined by claim 17 wherein the organic borate ester comprises trimethyl borate.

20. The process defined by claim 19 wherein the first gases comprise tetraethyl orthosilicate.

* * * * *